US005976931A

United States Patent [19]
Yew et al.

[11] Patent Number: 5,976,931
[45] Date of Patent: *Nov. 2, 1999

[54] METHOD FOR INCREASING CAPACITANCE

[75] Inventors: Tri-Rung Yew, Hsin-Chu; Water Lur; Shih-Wei Sun, both of Taipei, all of Taiwan

[73] Assignee: United Microelectronics Corp., Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/775,813

[22] Filed: Dec. 31, 1996

Related U.S. Application Data

[60] Provisional application No. 60/025,096, Aug. 30, 1996.
[51] Int. Cl.$^6$ ............................................. H01L 21/8242
[52] U.S. Cl. .......................................... 438/255; 438/398
[58] Field of Search ................................. 437/47, 48, 52, 437/60, 919; 438/238–253, 255, 381, 396, 398

[56] References Cited

U.S. PATENT DOCUMENTS

| 5,447,878 | 9/1995 | Park et al. | 437/52 |
| 5,769,952 | 6/1998 | Komino | 118/733 |

OTHER PUBLICATIONS

S.Wolf and R.N. Tauber, "Silicon Processing for the VLSI Era vol. 1—Process Technology", Lattice Press, p. 1, 1986.
N. Matsuo et al., "Nucleation and growth mechanism of hemispheric grain polycrystalline silicon," Applied Physic Letter 60(21), pp. 2607–2609, May 1992.
H. Watanabe et al., "A novel capacitor with porous–Si electrode for high density DRAMs," Symposium on VLSI Technology, 1993, pp. 17–18.
Watanabe, et al., "Device Application and Structure Observation for Hemispherical–Grained Si," J. Appl. Phys. 71 (7), pp. 3538–3543, Apr. 1, 1992.
Fazan, et al., "Electrical Characterization of Textured Interpoly Capacitors for Advanced Stacked DRAMs," IEEE, pp. 90–663–666, (1990).
Sakao, et al., "A Capacitor–Over–Bit–Line (COB) Cell With a Hemispherical–Grain Storage Node for 64Mb DRAMs," IEEE, pp. 90–655–658, (1990).
Rosato, et al., "Ultra–High Capacitance Nitride Films Utilizing Surface Passivation on Rugged Polysilicon," J. Electrochem. Soc., vol. 139, No. 12, pp. 3678–3682 (Dec. 1992).

*Primary Examiner*—Joni Chang
*Attorney, Agent, or Firm*—Rabin & Champagne, P.C.

[57] ABSTRACT

The capacitor of a DRAM cell is formed by depositing a layer of doped polysilicon, patterning the layer of doped polysilicon to define the extent of the capacitor's lower electrode and then depositing a first layer of hemispherical-grained silicon (HSG-Si) on the layer of doped polysilicon. Growth of the first layer of HSG-Si is interrupted and then a second layer of HSG-Si is grown. In one aspect, growth of the first layer of HSG-Si may be interrupted by either cooling the deposition substrate or stopping deposition for a period of time and then reinitiating deposition to provide a second layer of HSG-Si on the surface of the electrode. The interruption of the growth of the first layer, whether by cooling or by delay, is sufficient if the reinitiated growth initiates in a manner that is independent of the first process; i.e., the second layer of HSG-Si grows independently. In a different aspect of the invention, growth of the first layer may be interrupted by removing the electrode from the deposition system and performing an etch back operation. After the etch back operation, the electrode is reintroduced to the deposition system and a second layer of HSG-Si is grown on the etched surface. This textured silicon structure forms the lower electrode of the DRAM capacitor.

19 Claims, 2 Drawing Sheets

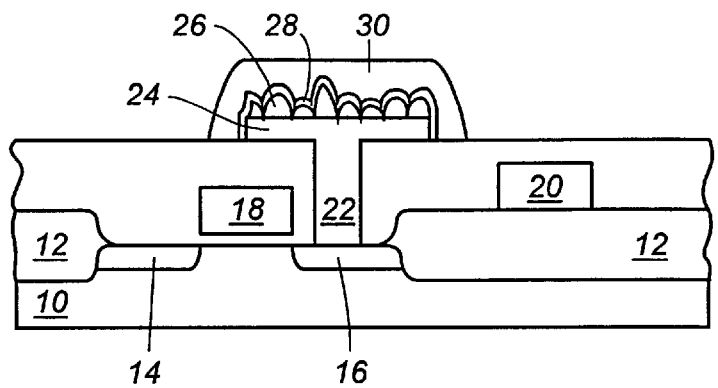
FIG. 1 - Prior Art
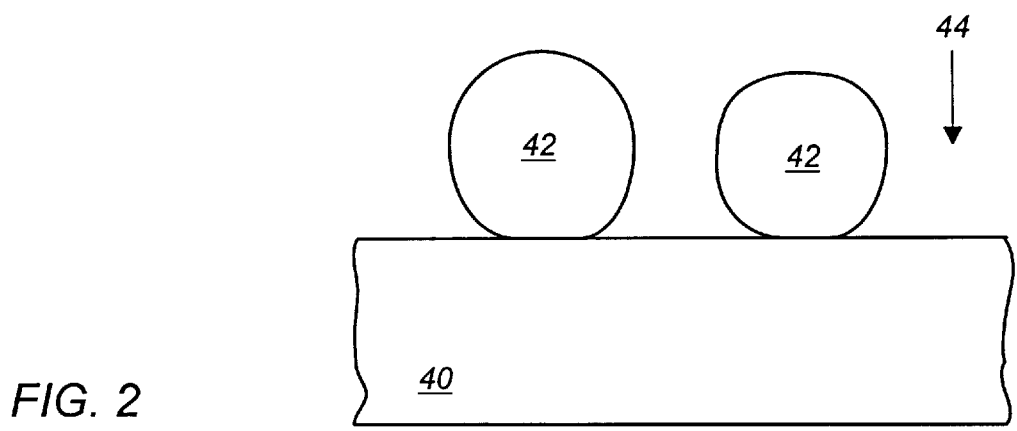
FIG. 2
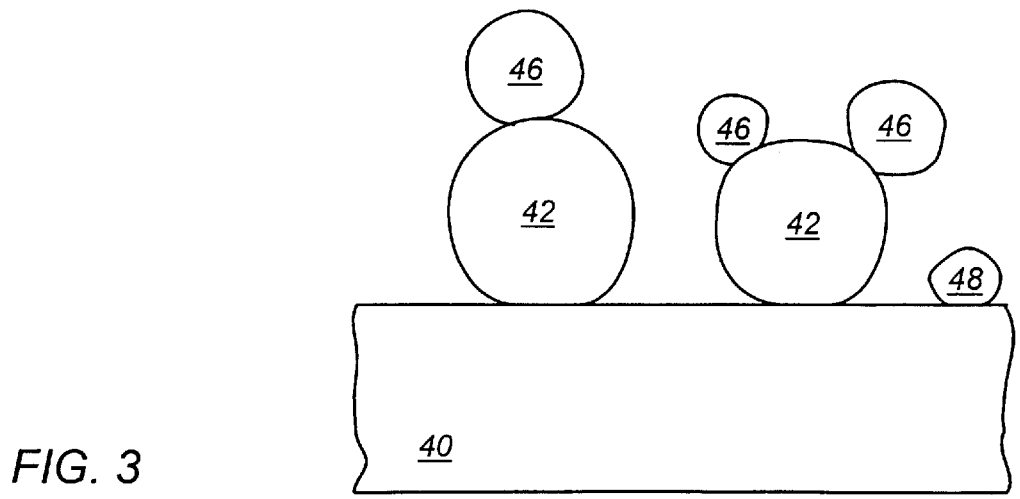
FIG. 3

METHOD FOR INCREASING CAPACITANCE

This application claims priority from provisional application Serial No. 60/025,096 filed Aug. 30, 1996.

BACKGROUND OF THE INVENTION

1. Field of the Invention

The present invention relates to the formation of high capacitance structures in integrated circuit devices and, more particularly, to the formation of electrodes which incorporate at least one textured surface.

2. Description of the Related Art

Historically, increasing the density of integrated circuit devices has been accomplished in part by decreasing the size of structures such as wiring lines and transistor gates and by decreasing the separation between the structures which make up the integrated circuit device. Reducing the size of circuit structures is generally referred to as decreasing the "design rules" used for the manufacture of the integrated circuit device. For dynamic random access memories (DRAMs), information is typically stored by selectively charging or discharging each capacitor of an array of capacitors formed on the surface of a semiconductor substrate. Most often, a single bit of binary information is stored at each capacitor by associating a discharged capacitor state with a logical zero and a charged capacitor state with a logical one. The surface area of the plates of the memory capacitors determines the amount of charge that can be stored on each of the capacitors, given the typical fixed operating voltage of a memory, the electrode separation that can reliably be manufactured, and the dielectric constant of the capacitor dielectric typically used in the capacitors. Reducing the surface area occupied by such a DRAM capacitor in accordance with reduced design rules tends to reduce the surface area of the capacitor plates and reduce the amount of charge that can be stored on the memory capacitor (i.e., the capacitance).

The amount of charge stored on memory capacitors typically must be large enough to obtain reliable operation of the memory. For recent ultra large scale integration ("ULSI") DRAM designs, further reductions in the amount of charge stored on the DRAM memory capacitors could prevent the information stored on the capacitor from reliably being read out. In addition, because charge inevitably drains from memory capacitors, DRAMs require a periodic refresh of the charge stored on each of the capacitors of the DRAM to ensure that the stored charge remains above the minimum detectable level. Further reductions in capacitance would require more frequent refresh operations for the DRAM, which are undesirable because at least portions of the DRAM are unavailable for the reading and writing of information during refresh operations.

To address the challenges of reduced structure sizes, DRAM designs have been proposed which incorporate capacitors having vertical extensions above the surface of the substrate (i.e., "stacked" capacitors) or below the surface of the substrate (i.e., "trench" capacitors). By adopting a more three-dimensional structure, such DRAM designs provide memory capacitors having larger capacitances but which consume less of the substrate surface area. Although stacked capacitor and trench capacitor designs involve more complicated structures which are more difficult to manufacture, these designs have recently been adopted with at least some success. Alternative, less expensive and more easily manufactured structures providing improved capacitance are desirable. In addition, it is desirable to reduce the vertical extent of the storage capacitor to allow the production of more planar device structures. There additionally remains a need to increase the capacitance of DRAM storage capacitors while decreasing the amount of surface area consumed by the DRAM storage capacitor on the surface of the semiconductor substrate.

One technique that has been proposed for increasing the capacitance obtained for a fixed substrate surface area is to use rugged or textured silicon as the bottom plate for the memory capacitor. The advantages of this technique are illustrated in part in FIG. 1, which shows in cross-section a portion of a DRAM having a memory capacitor with a lower plate electrode formed from textured silicon. The illustrated DRAM consists of a silicon substrate 10, field oxidation regions 12, source/drain regions 14, 16 and gate electrode 18 of the memory cell's transfer field effect transistor ("FET") and a wiring line 20 formed over one of the field oxide regions 12. The wiring line 20 interconnects portions of the DRAM in the well-known manner and the transfer FET acts as a switch during capacitor read out and write operations. In such a DRAM, the memory capacitor may be connected to a source/drain region 16 of the transfer FET by a vertically extending interconnect 22 which terminates in a plate 24 formed from conventional polysilicon. A layer of textured silicon 26 is formed on the upper surface of the conventional polysilicon plate 24 to complete the lower electrode of the charge storage capacitor. A thin dielectric layer 28 covers the surface of both the layer of textured silicon 26 and the exposed portions of the plate 24, and a layer of doped polysilicon 30 is formed on the dielectric layer 28 to serve as the upper electrode for the capacitor. By using textured silicon within the lower electrode of the capacitor, the surface area of the capacitor is increased without extending the capacitor electrodes laterally, so that the illustrated structure has improved capacitance for a fixed surface area.

A variety of techniques have been used to produce textured silicon for use in semiconductor devices like the DRAM illustrated in FIG. 1. Watanabe, et al., "Device Application and Structure Observation for Hemispherical-Grained Si," describes the formation of hemispherical-grained polycrystalline silicon ("HSG-Si", used hereinafter to refer to textured silicon) by low pressure chemical vapor deposition (LPCVD) from silane gas ($SiH_4$). The surface roughness or texture of the HSG-Si films was maximized so that the HSG-Si films could be used as plates of DRAM memory capacitors, with maximum capacitances being obtained for polysilicon (HSG-Si) deposited at a substrate temperature of 590° C. Substrate deposition temperatures of ten degrees higher or lower than 590° C. produced an unacceptable surface texture, that is, these conditions produced an undesirably flat surface which did not provide appreciably larger capacitance electrodes than conventional polysilicon. Capacitors made using a lower electrode of HSG-Si deposited using LPCVD onto a substrate at a temperature of 590° C. exhibited a capacitance per unit area approximately two times larger than similar capacitors made using flat lower electrodes deposited at substrate temperatures of either 580° C. or 600° C. (or higher).

Fazan, et al., "Electrical Characterization of Textured Interpoly Capacitors for Advanced Stacked DRAMs," describes an alternative process for forming a textured surface on a layer of doped polycrystalline silicon. Wet oxidation at 907° C. is used to grow an oxide film on the surface of a doped polysilicon layer and then the oxide film is etched to produce a textured surface on the polycrystalline silicon. Etching of the oxide layer grown on the polysilicon layer results in creation of a textured polysilicon surface due to the greater levels of oxidation that occurs along the grain boundaries of doped polysilicon layers coupled with the subsequent removal of the oxide from the polysilicon grain boundaries. The extent of surface roughness produced in this process directly relates to the size of the polysilicon grains, so that small grained films are required to produce desirable levels of surface texture.

The article by Sakao, et al., "A Capacitor-Over-Bit-Line (COB) Cell with a Hemispherical-Grain Storage Node for 64 Mb DRAMs," 1990 *IEDM* describes the formation of a DRAM capacitor incorporating HSG-Si to provide increased storage capacitance. Formation of the Sakao capacitor proceeds as follows. After the formation of the source, drain and gate of the transfer FET, a layer of oxide is formed over the gate and word line. A contact via is opened to the drain of the transfer FET and a vertical interconnect conductor is formed to extend from the drain to the surface of the layer of oxide. A layer of conventional polysilicon is deposited by LPCVD at 600° C. in contact with the vertical interconnect. The layer of conventional polysilicon is patterned by lithography and reactive ion etching to form a core storage node connected to the drain of the transfer FET through the vertical interconnect.

Hemispherical-grained silicon is formed over the surface of the core storage node by LPCVD deposition using silane diluted with helium at one Torr. pressure and a substrate temperature of 550° C. The HSG-Si deposited had a grain size of eighty nanometers and the layer had a thickness of at least eighty nanometers over the conventional polysilicon of the core storage node. The HSG-Si was then etched back by reactive ion etching using HBr as an etch gas to remove the HSG-Si from the surface of the oxide layer adjacent to the core storage node. Etching back also removes the HSG-Si from the surface of the storage node, reproducing the texture of the original HSG-Si surface on the surface of the conventional polysilicon within the core storage node. Thus, the lower electrode of the Sakao DRAM capacitor is conventional polysilicon having a surface structure (texture, roughness) that is substantially the same as HSG-Si having a grain size of eighty nanometers.

The use of HSG-Si within lower electrodes of DRAM capacitors has been successful in approximately doubling the capacitance of DRAM capacitors, but no further improvements in capacitance have been obtained using HSG-Si. It is difficult to justify the increased complexity of maintaining the precise deposition conditions necessary to HSG-Si formation for only a factor of two increase in capacitance.

SUMMARY OF THE PREFERRED EMBODIMENTS

It is accordingly an object of this invention to provide an increased capacitance utilizing an HSG-Si layer in the process of making an electrode.

A first aspect of the present invention forms a semiconductor device by providing a layer of silicon on or above a silicon substrate and providing a first layer of hemispherical-grained silicon on the layer of silicon. A second layer of hemispherical-grained silicon is deposited over the first layer of hemispherical-grained silicon so that independent grains of hemispherical-grained silicon are formed on the grains of the first layer of hemispherical-grained silicon.

Another aspect of the present invention forms a semiconductor device by providing a deposition substrate comprising silicon and depositing a first layer of hemispherical-grained silicon over the deposition substrate in a first deposition process. A second layer of hemispherical-grained silicon is deposited over the deposition substrate in a second deposition process so that grains of hemispherical-grained silicon of the second layer grow independently of grains of hemispherical-grained silicon formed in the first deposition process. The deposition substrate is patterned, a dielectric layer is formed over the second layer of hemispherical-grained silicon, and a conductive layer is deposited over the dielectric layer.

Still another aspect of the present invention provides a semiconductor device by providing a deposition substrate comprising silicon and providing a first layer of hemispherical-grained silicon on the deposition substrate. A second layer of hemispherical-grained silicon is deposited over the deposition substrate in so that grains of hemispherical-grained silicon of the second layer grow independently of grains in the first layer of hemispherical-grained silicon. The deposition substrate is patterned, a dielectric layer is formed over the second layer of hemispherical-grained silicon, and a conductive layer is deposited over the dielectric layer.

BRIEF DESCRIPTION OF THE DRAWINGS

FIG. 1 illustrates in cross-section a portion of a DRAM utilizing a memory capacitor having a lower electrode incorporating a layer of hemispherical-grained silicon.

FIGS. 2–3 illustrate stages in a preferred process for forming capacitor electrodes in accordance with the present invention.

DESCRIPTION OF THE PREFERRED EMBODIMENTS

Figure 4:
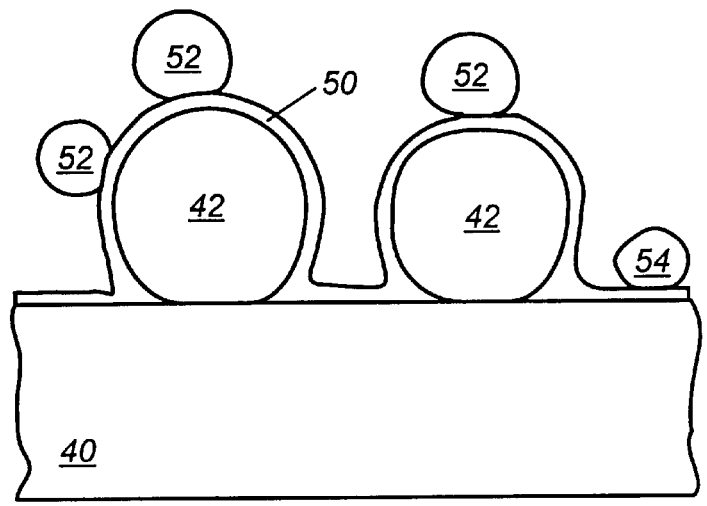
FIGS. 4–5 illustrate alternative embodiments of the process illustrated in FIG. 3.

Preferred embodiments of the present invention provide a first layer of hemispherical-grained silicon (HSG-Si) on the surface of a layer of polysilicon. Growth of the first layer of HSG-Si is interrupted and then a second layer of HSG-Si is grown. In one aspect of the present invention, growth of the first layer of HSG-Si may be interrupted by either cooling the deposition substrate or by stopping the deposition process for a period of time and then reinitiating deposition to provide a second layer of HSG-Si on the surface of the electrode. The interruption of the growth of the first layer, whether by cooling or by delay, is sufficient if the reinitiated growth initiates in a manner that is independent of the first process; i.e., the second layer of HSG-Si grows independently. Independent growth of the second layer mean that the crystallites of the second HSG-Si layer initiate growth from new nucleation sites rather than continuing to grow the already present crystallites. Thus, at least some of the grains of the second HSG-Si layer will grow as distinct HSG-Si grains from surfaces of the grains of the first HSG-Si layer.

In a variation on this aspect, the growth of the first layer of HSG-Si might be interrupted by growing a very thin layer of amorphous silicon on surfaces of the grains of the first layer of HSG-Si. The grains of the second layer of HSG-Si would then grow from the surface of the thin amorphous silicon layer.

In another aspect of the present invention, a capacitor electrode is prepared by growing a first layer of HSG-Si on a layer of doped polysilicon. Growth of the first layer of HSG-Si is interrupted by stopping the deposition process and preferably removing the electrode from the deposition system and performing an etch back operation. After the etch back operation, the electrode may be reintroduced to the deposition system and a second layer of HSG-Si is grown on the etched surface. It is possible, for example, to etch back the first HSG-Si layer in such a way that the surface topography of the first HSG-Si layer is essentially reproduced in the doped polysilicon layer. Alternately, an undoped first layer of HSG-Si can be used as a mask for selectively etching an underlying layer of doped polysilicon. Appropriate etching systems include those that provide chlorine ions within the etchant to utilize the selectivity of the chlorine etching system, which etches doped polysilicon at a faster rate than undoped polysilicon. When this etch is applied to etch the first layer of undoped HSG-Si covering a layer of doped polysilicon, the HSG-Si is slowly etched while exposed portions of the underlying doped polysilicon are etched more rapidly. If the etching process continues until all of the HSG-Si is removed, then the surface of the doped layer of polysilicon will have an irregular array of cones and truncated cones with heights greater than the grain size of the originally-deposited HSG-Si layer. Subsequent growth of a second layer of HSG-Si on the surface of the textured doped polysilicon layers will necessarily be independent of the growth of the first HSG-Si layer, since the first HSG-Si layer is removed before growth of the second layer of HSG-Si. As with other embodiments of the present invention, growth of the second layer of HSG-Si on the etched surfaces of these embodiments provides a further increase in the surface area of the capacitor electrode.

FIGS. 2–4 illustrate aspects of preferred embodiments of the present invention. These figures are necessarily schematic and are exaggerated in several aspects to provide a better illustration of the present invention. Each of FIGS. 2–4 illustrate a portion of the lower electrode structure for a capacitor which could be substituted for the lower electrode of FIG. 1 made up of lower polysilicon plate 24 and upper HSG-Si layer 26. Referring now to FIG. 2, a layer of conventional polysilicon 40 is deposited by low pressure chemical vapor deposition (LPCVD) at 620° C. from silane ($SiH_4$) onto a layer of silicon oxide (not shown) deposited above a silicon substrate. The layer of conventional polysilicon 40 is preferably doped in situ during deposition, by ion implantation and annealing, or by a thermal diffusion process, all of which are well known. For example, layer 40 may be highly doped N-type by implantation of phosphorus ions followed by a rapid thermal anneal at a temperature of 1000–1100° C. for about 10–30 seconds. A plate of the conventional polysilicon 40 that will form the core of the lower electrode is defined through photolithography and etching. A first layer of HSG-Si will be deposited over this plate of conventional polysilicon 40.

It is preferred that the HSG-Si growth process be initiated on a clean silicon surface by cleaning native oxide from the surface of the polysilicon layer 40 before depositing the HSG-Si. A distinct cleaning step may be unnecessary if the growth of the HSG-Si layer is initiated immediately after forming the underlying layer of silicon, if the surface of the underlying silicon layer is maintained in a sufficient vacuum to prevent oxide growth. More practically it is to be expected that there will be a time interval between the growth of the underlying silicon layer and the initiation of HSG-Si growth. Alternately, if the layer of polysilicon is doped by implantation and annealing or by thermal diffusion, a layer of oxide will be grown on the surface of the layer of polysilicon. Accordingly, the surface of the underlying silicon layer is preferably cleaned before the initiation of HSG-Si growth. Native oxides may be cleaned from the surface of polysilicon by a variety of techniques, including HF dip, spin-etching using HF, vapor HF cleaning, or by an $H_2$ plasma cleaning. Preferably, the surface of the underlying silicon layer is hydrogenated as a result of the cleaning operation, because the hydrogenated surface serves to protect the polysilicon surface from reoxidation. Each of the cleaning techniques listed above will achieve the desired hydrogenation of the polysilicon surface.

After cleaning, a layer of HSG-Si 42 is formed on the surface of the conventional polysilicon layer 40. The layer may be formed in any of the well-known methods and may consist of depositing HSG-Si by LPCVD from silane source gas onto a substrate held at a temperature of between 555° C. to 595° C. The resulting structure is shown in FIG. 2, and includes an irregular surface of HSG-Si. Due to the random nature of the nucleation of HSG-Si growth, it is likely that the underlying doped polysilicon layer 40 will be exposed at particular sparse regions in the layer of HSG-Si, such as that indicated at 44 in FIG. 2. Growth of a layer of HSG-Si 42 on the surface of a layer of polysilicon 40 has been observed to increase capacitance by approximately a factor of 1.8 times over the capacitance provided by the smooth surface of the polysilicon layer 40. It has been difficult to achieve further increases in capacitance through growth of HSG-Si layers, possibly due to loss of surface area as the crystallites of a first layer of HSG-Si grow sufficiently large that surfaces of adjacent crystallites grow together.

Accordingly, preferred embodiments of the present invention provide further increases in capacitance by interrupting the growth of the first HSG-Si layer and then reinitiating growth of a second layer of HSG-Si, with the second layer being grown in a manner that may be similar to the growth of the first layer of HSG-Si. Growth of the second layer of HSG-Si is initiated in a manner that is independent of the growth of the first layer of HSG-Si. Thus, growth of the second layer of HSG-Si will generally contribute little to the further growth of the crystallites of the first layer of HSG-Si. Rather, growth of the second layer of HSG-Si grows new grains on the surface of the electrode, including on the surface of the grains of the first layer of HSG-Si. This is illustrated in FIG. 3, where the second layer of HSG-Si forms distinct grains 46 of HSG-Si. It is also possible that the second layer of HSG-Si will nucleate growth of grains 48 at new locations on the surface of the polysilicon layer 40. Most preferably, the grains grown in the second layer of HSG-Si are smaller than the grains of the first layer, which may be accomplished by growing the second layer for a shorter period of time than is used for growing the first layer. The process of interrupting growth of a layer of HSG-Si and subsequently reinitiating growth of an independent HSG-Si layer can be repeated any number of times, so that third and fourth successive independent layers may be grown on existing second layers of HSG-Si.

It is important to the practice of the present invention that deposition of the first layer of HSG-Si be interrupted in some fashion, so that continued presence of the capacitor electrode within the HSG-Si deposition environment contributes to the growth of new crystallites for a second layer, rather than the continued growth of the first layer of HSG-Si. A number of different techniques can be used to interrupt the growth of the first layer of HSG-Si. For example, the flow of reactant gases (e.g., $SiH_4$) to the deposition chamber can be halted and the capacitor electrode can be left in the deposition chamber, otherwise under deposition conditions, for a period of time sufficient that subsequent reintroduction of the reactant gases will initiate growth at new nucleation sites. This may occur in a time period of, for example, thirty minutes. Typical LPCVD systems operate at pressures of about $10^4$ Torr., which is sufficient to allow contaminants to collect on the surface of already deposited HSG-Si grains as to inhibit further growth of those grains upon reinitiation of the growth process. A similar process may occur if instead of waiting for a period of time, the capacitor electrode is cooled and the reheated to the HSG-Si deposition temperature. Alternately, the capacitor electrode might be heated sufficiently to discontinue HSG-Si deposition in favor of polysilicon deposition and then cooled to the HSG-Si deposition range to reinitiate HSG-Si deposition.

A different tactic for interrupting growth of the first layer of HSG-Si is to deposit a layer of interrupting material of as little as a few angstroms in thickness over the surface of the first layer's HSG-Si grains so that the second layer of HSG-Si grows on the layer of interrupting material. The most easily formed and most compatible layer of interrupting material is a layer of amorphous silicon. A layer of amorphous silicon of anywhere from a few angstroms up to about two hundred angstroms can be deposited within the same LPCVD system as is used for the deposition of HSG-Si. By temporarily lowering the temperature of the capacitor electrode to 550° C. or below, amorphous silicon can be deposited on the electrode.

After properly interrupting the growth of the first HSG-Si layer, one or more additional layers of HSG-Si are grown on the surface of the capacitor electrode, preferably forming smaller grains for each successive layer. FIG. 4 shows a thin amorphous silicon layer 50 formed over the grains 42 of the first layer of HSG-Si and over the exposed portions of the polysilicon layer 40. A second layer of HSG-Si is then formed, with grains 52 formed on the amorphous silicon layer 50 over the first HSG-Si layer grains 42 and with grains 54 formed on the amorphous silicon layer 50 on the polysilicon layer 40. After all of the surface texture is formed on the capacitor electrode, the HSG-Si layer is doped by in situ doping during deposition, by ion implantation and annealing, or by a thermal diffusion process either from the surface of the HSG-Si layers or from the underlying layer of polysilicon 40, all of which are well known. If the polysilicon layer 40 was not doped previously, it can be doped at this time by, for example, by ion implantation. In addition, if an amorphous silicon layer 50 was incorporated in the structure, then the amorphous silicon layer is doped at the same time as the HSG-Si layers are doped. Processing continues by patterning the electrode, if it was not previously patterned, forming a dielectric layer over the surface of the lower capacitor electrode, and forming an upper capacitor electrode. Patterning the electrode may include patterning the layer of doped polysilicon to provide an upper electrode of a capacitor. Forming the upper capacitor electrode may include etching the layer of doped polysilicon to laterally define an extent of an electrode structure. Further discussion of relevant aspects of this process is provided below. First, however, another aspect of the present invention is described.

In another aspect of the present invention, the interruption in the growth of the first HSG-Si layer includes etching the surface of the HSG-Si/polysilicon structure shown in FIG. 2 after deposition of the first HSG-Si layer. This etch is preferably anisotropic and may or may not be selective between the HSG-Si grains 42 and the polysilicon layer 40. If the etch is not selective, then the etch merely reproduces the topography of the HSG-Si grains 42 in the polysilicon layer 40. Alternatively, the HSG-Si grains 42 may not be doped and the polysilicon layer 40 may be doped and a dopant sensitive etchant used to selectively etch the FIG. 2 structure. In this process, the HSG-Si grains 42 act as a mask for the etching process and exposed regions of the polysilicon layer 40 are etched more rapidly than the HSG-Si grains. The result of the etching process is an electrode surface having a higher surface roughness or topography than an HSG-Si layer on a polysilicon layer, such as that shown in FIG. 2.

Figure 5:
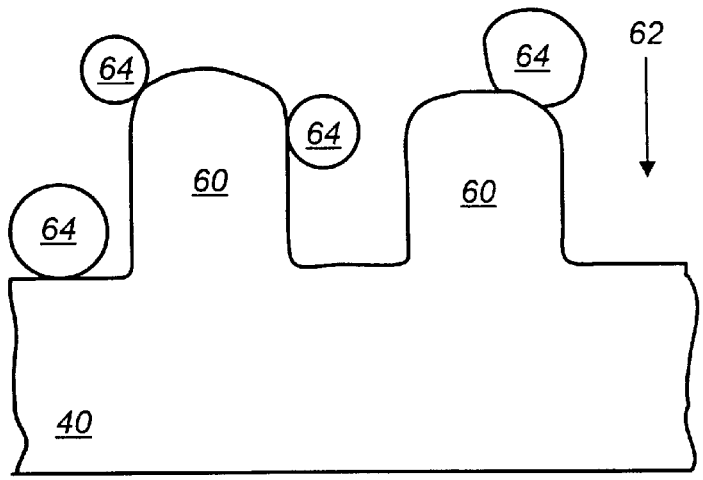

A suitable etch environment for the selective etch process may be a reactive ion etcher such as the P5000 magnetically enhanced reactive ion etcher manufactured by Applied Materials Corporation. The etch gases may consist of chlorine ($Cl_2$) and hydrogen bromide (HBr) provided at a $Cl_2$/HBr ratio of 70 sccm/30 sccm, for a total pressure of 60 mTorr and at an input energy level of 300 W. These conditions are exemplary, and other conditions are also well suited. A selectivity ratio for the etch rate of doped polysilicon to the etch rate of undoped HSG-Si is approximately 2:1 for these conditions. The etch process preferably continues to completely etch away the HSG-Si grains 42, leaving raised surfaces 60 and depressions 62 on the surface of the layer of doped polysilicon 40 (FIG. 5). An advantage of completely removing the HSG-Si layer is that no additional doping step to render the HSG-Si conductive is then necessary. In either case, a second layer 64 of HSG-Si is grown on the etched surface of the polysilicon layer 40. The HSG-Si layer 64 is doped at this time. Processing continues by patterning the electrode, if it was not previously patterned, forming a dielectric layer over the surface of the lower capacitor electrode, and forming an upper capacitor electrode.

When the surface of a structure such as that illustrated in FIGS. 3–5 is coated with a thin dielectric layer and an upper layer of conductive material is deposited on the dielectric layer, a high capacitive coupling can be established between the textured polysilicon layer and the upper layer of conductive material. Preferably, a second layer of heavily doped N-type polysilicon is provided, and a capacitor structure like that illustrated in FIG. 1 is formed. For such a structure, it is desirable to use a dielectric layer that is thin in comparison to the scale of the texture on the surface. For the illustrated layer, which has surface structures of approximately one hundred nanometers in size, it would be desirable to use a dielectric layer that is less than about eight nanometers thick. It is also desirable to form the dielectric layer from a material having a high dielectric constant. An appropriate dielectric layer can be formed by depositing a layer of silicon nitride on the surface of the HSG-Si layer, for example by CVD, and then growing a thin oxide layer on the surface of the silicon nitride layer. Sometimes, such an "NO" layer is formed on top of an oxide layer, such as a native oxide layer, covering the surface of the textured polysilicon layer, so that the actual dielectric film formed has an "ONO" structure. According to Rosato, et al., "Ultra-High Capacitance Nitride Films Utilizing Surface Passivation on Rugged Polysilicon," *J. Electrochem. Soc.,* Vol. 139, No. 12, pages 3678–82 (December 1992), such an "ONO" structure can be formed to a thickness of approximately 4 nanometers. The teachings of the Rosato article, including the teachings regarding the formation of ONO dielectric layers on rugged polysilicon and on the passivation of native oxide surfaces before the deposition of a CVD nitride layer, are hereby incorporated by reference. Alternately, a thin layer of tantalum pentoxide or other high dielectric constant material can be used as a dielectric layer covering the textured polysilicon surface and acting as a capacitor dielectric.

While the method for forming textured polysilicon has been described herein with specific reference to forming a capacitor such as that shown in the DRAM structure of FIG. 1, textured polysilicon in accordance with the present invention can be utilized in other structures. For example, the textured silicon might also be used in other capacitor structures, including on the fins of a variety of stacked capacitor structures. Additionally, textured silicon layers in accordance with preferred embodiments of the present invention might also be used on the surface of the floating gate in an EEPROM or a flash memory. Use of a textured polysilicon surface and a thin ONO dielectric layer between a polysilicon floating gate and a polycide control gate formed over the ONO dielectric layer greatly improves the coupling between the floating gate and the control gate as compared to more conventional flash memory device structures.

While the present invention has been described with reference to certain preferred embodiments thereof, it is to be understood that the present invention is not limited to a particular preferred embodiments described herein. Rather, the scope of the present invention is to be determined from the following claims.

What is claimed:

1. A method of making a semiconductor device, comprising the steps of:

providing a layer of silicon on or above a silicon substrate;

growing a first layer of hemispherical-grained silicon on the layer of silicon;

interrupting the step of growing the first layer of hemispherical-grained silicon; and growing a second layer of hemispherical-grained silicon over the first layer of hemispherical-grained silicon so that independent grains of the second layer of hemispherical-grained silicon are formed directly on grains of the first layer of hemispherical-grained silicon, wherein the steps of interrupting and growing the second layer of hemispherical-grained silicon are both performed without removing the substrate from a deposition chamber.

2. The method of claim 1, wherein the step of growing the first layer of hemispherical-grained silicon includes performing chemical vapor deposition on the layer of silicon.

3. The method of claim 2, wherein the layer of silicon is doped polysilicon.

4. The method of claim 2, wherein the second layer of hemispherical-grained silicon is formed by chemical vapor deposition.

5. The method of claim 4, wherein the step of interrupting the step of growing the first layer of hemispherical-grained silicon comprises cooling or heating the layer of silicon.

6. The method of claim 4, wherein the step of interrupting the step of growing the first layer of hemispherical-grained silicon comprises stopping growth of the first layer of hemispherical-grained silicon for a first time period prior to initiating the step of growing the second layer of hemispherical-grained silicon, independently from growth of the first layer of hemispherical-grained silicon.

7. The method of claim 2, wherein the step of growing the second layer of hemispherical-grained silicon includes reinitiating the chemical vapor deposition of hemispherical-grained silicon to provide a growing step independent of the chemical vapor deposition of the first layer of hemispherical-grained silicon.

8. The method of claim 1, wherein the steps of growing the first and second layers of hemispherical-grained silicon each include performing low pressure chemical vapor deposition at a temperature of less than 600° C.

9. The method of claim 5, wherein the step of interrupting the step of growing the first layer of hemispherical-grained silicon includes cooling the layer of silicon such that the step of growing a second layer of hemispherical-grained silicon over the first layer of hemispherical-grained silicon includes initiating growing the second layer of hemispherical-grained silicon independently of the step of growing the first layer of hemispherical-grained silicon on the layer of silicon.

10. The method of claim 9, wherein initiating growing the second layer of hemispherical-grained silicon independently of the step of growing the first layer of hemispherical-grained silicon on the layer of silicon includes initiating growth of crystallites of the second layer of hemispherical-grained silicon from new nucleation sites.

11. The method of claim 5, wherein the step of interrupting the step of growing the first layer of hemispherical-grained silicon includes heating the layer of silicon to an extent that growth of hemispherical-grained silicon discontinues.

12. The method of claim 11, wherein the step of growing a second layer of hemispherical-grained silicon over the first layer of hemispherical-grained silicon includes cooling the layer of silicon to the extent that growth of hemispherical-grained silicon continues.

13. The method of claim 1, wherein the step of interrupting the step of growing the first layer of hemispherical-grained silicon includes stopping deposition for a time period sufficient such that the step of growing a second layer of hemispherical-grained silicon over the first layer of hemispherical-grained silicon includes initiating growing the second layer of hemispherical-grained silicon independently of the step of growing the first layer of hemispherical-grained silicon on the layer of silicon.

14. The method of claim 13, wherein stopping deposition includes halting a flow of a reactant gas within the deposition chamber.

15. The method of claim 13, wherein initiating growth of the second layer of hemispherical-grained silicon independently of the step of growing the first layer of hemispherical-grained silicon on the layer of silicon includes initiating growth of crystallites of the second layer of hemispherical-grained silicon from new nucleation sites.

16. The method of claim 1, wherein the step of growing a second layer of hemispherical-grained silicon over the first layer of hemispherical-grained silicon includes growing grains of the second layer of hemispherical-grained silicon that are smaller than grains of the first layer of hemispherical-grained silicon.

17. The method of claim 16, wherein the step of growing a second layer of hemispherical-grained silicon over the first layer of hemispherical-grained silicon includes growing substantially all the grains of the second layer of hemispherical-grained silicon smaller than substantially all the grains of the first layer of hemispherical-grained silicon.

18. The method of claim 1, wherein the step of growing a second layer of hemispherical-grained silicon includes growing the second layer of hemispherical grained silicon on the layer of silicon.

19. The method of claim 1, wherein the step of growing a first layer of hemispherical-grained silicon is performed for a first period of time and the step of growing a second layer of hemispherical-grained silicon is performed for a second period of time that is shorter than the first period of time.

* * * * *